(12) United States Patent
Kuo et al.

(10) Patent No.: US 12,237,398 B2
(45) Date of Patent: Feb. 25, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chia-Ming Kuo, Kaohsiung (TW); Po-Jen Chuang, Kaohsiung (TW); Yu-Ren Wang, Tainan (TW); Ying-Wei Yen, Miaoli County (TW); Fu-Jung Chuang, Kaohsiung (TW); Ya-Yin Hsiao, Taipei (TW); Nan-Yuan Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/338,691

(22) Filed: Jun. 4, 2021

(65) Prior Publication Data

US 2021/0296466 A1 Sep. 23, 2021

Related U.S. Application Data

(62) Division of application No. 15/996,539, filed on Jun. 4, 2018, now Pat. No. 11,063,135.

(30) Foreign Application Priority Data

May 9, 2018 (CN) .......................... 201810436649.6

(51) Int. Cl.
*H01L 29/66* (2006.01)
*H01L 21/02* (2006.01)
(Continued)

(52) U.S. Cl.
CPC ...... *H01L 29/6656* (2013.01); *H01L 21/0214* (2013.01); *H01L 21/02167* (2013.01); *H01L 21/0217* (2013.01); *H01L 21/26513* (2013.01); *H01L 21/324* (2013.01); *H01L 29/0847* (2013.01); *H01L 29/66545* (2013.01);
(Continued)

(58) Field of Classification Search
CPC ............. H01L 29/6656; H01L 21/0214; H01L 21/02167; H01L 21/0217; H01L 21/26513; H01L 21/324; H01L 29/0847; H01L 29/66545; H01L 29/6659; H01L 29/7833; H01L 21/0206; H01L 21/28088; H01L 21/3212; H01L 21/32133; H01L 29/42376;
(Continued)

(56) References Cited

U.S. PATENT DOCUMENTS 8,461,049 B2 6/2013 Chang et al.
9,029,931 B2 5/2015 Kawashima
(Continued)

FOREIGN PATENT DOCUMENTS

CN 106252230 A 12/2016
CN 106683990 A 5/2017

*Primary Examiner* — Benjamin Tzu-Hung Liu
(74) *Attorney, Agent, or Firm* — Winston Hsu

(57) ABSTRACT

A method for fabricating semiconductor device includes the steps of: forming a gate structure on a substrate; forming a first spacer adjacent to the gate structure, wherein the first spacer comprises silicon carbon nitride (SiCN); forming a second spacer adjacent to the first spacer, wherein the second spacer comprises silicon oxycarbonitride (SiOCN); and forming a source/drain region adjacent to two sides of the second spacer.

1 Claim, 4 Drawing Sheets

(51) Int. Cl.
*H01L 21/265* (2006.01)
*H01L 21/28* (2006.01)
*H01L 21/321* (2006.01)
*H01L 21/3213* (2006.01)
*H01L 21/324* (2006.01)
*H01L 29/08* (2006.01)
*H01L 29/49* (2006.01)
*H01L 29/51* (2006.01)
*H01L 29/78* (2006.01)
*H01L 29/423* (2006.01)

(52) U.S. Cl.
CPC ...... *H01L 29/6659* (2013.01); *H01L 29/7833* (2013.01); *H01L 21/0206* (2013.01); *H01L 21/28088* (2013.01); *H01L 21/3212* (2013.01); *H01L 21/32133* (2013.01); *H01L 29/42376* (2013.01); *H01L 29/4966* (2013.01); *H01L 29/517* (2013.01); *H01L 29/6653* (2013.01)

(58) Field of Classification Search
CPC ................ H01L 29/4966; H01L 29/517; H01L 29/6653
See application file for complete search history.

(56) References Cited

U.S. PATENT DOCUMENTS

| | | | |
|---|---|---|---|
| 9,418,897 B1 | 8/2016 | Ching | |
| 10,262,894 B2 | 4/2019 | Hsieh | |
| 10,269,940 B2 | 4/2019 | Young | |
| 2007/0037336 A1* | 2/2007 | Kwon | ............ H01L 21/823468 257/E27.099 |
| 2009/0186475 A1* | 7/2009 | Ting | ................ H01L 21/823814 257/E21.294 |
| 2013/0252430 A1 | 9/2013 | Ranjan et al. | |
| 2016/0141381 A1* | 5/2016 | Kim | ...................... H01L 29/785 257/288 |
| 2017/0125586 A1* | 5/2017 | Lee | ........................ H01L 29/785 |
| 2017/0221757 A1* | 8/2017 | Hsieh | ................ H01L 21/76897 |
| 2018/0151419 A1 | 5/2018 | Wu | |

\* cited by examiner

SEMICONDUCTOR DEVICE AND METHOD FOR FABRICATING THE SAME

CROSS REFERENCE TO RELATED APPLICATIONS

This application is a division of U.S. application Ser. No. 15/996,539 filed Jun. 4, 2018, and incorporated herein by reference in its entirety.

BACKGROUND OF THE INVENTION

1. Field of the Invention

The invention relates to a semiconductor device and method for fabricating the same, and more particularly to a metal gate transistor and method for fabricating the same.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistor, since elements such as spacer and contact etch stop layer (CESL) are typically made of material having substantially higher dielectric constant, the overlap capacitance between gate structure and source/drain region could not have been controlled under a desirable range thereby affecting the performance of the device substantially. Hence, how to resolve this issue has become an important task in this field.

SUMMARY OF THE INVENTION

According to an embodiment of the present invention, a method for fabricating semiconductor device includes the steps of: forming a gate structure on a substrate; forming a first spacer adjacent to the gate structure, wherein the first spacer comprises silicon carbon nitride (SiCN); forming a second spacer adjacent to the first spacer, wherein the second spacer comprises silicon oxycarbonitride (SiOCN); and forming a source/drain region adjacent to two sides of the second spacer.

According to another aspect of the present invention, a semiconductor device includes: a gate structure on a substrate; a first spacer adjacent to the gate structure, wherein the first spacer comprises silicon carbon nitride (SiCN); a second spacer adjacent to the first spacer, wherein the second spacer comprises silicon oxycarbonitride (SiOCN); and a source/drain region adjacent to two sides of the second spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
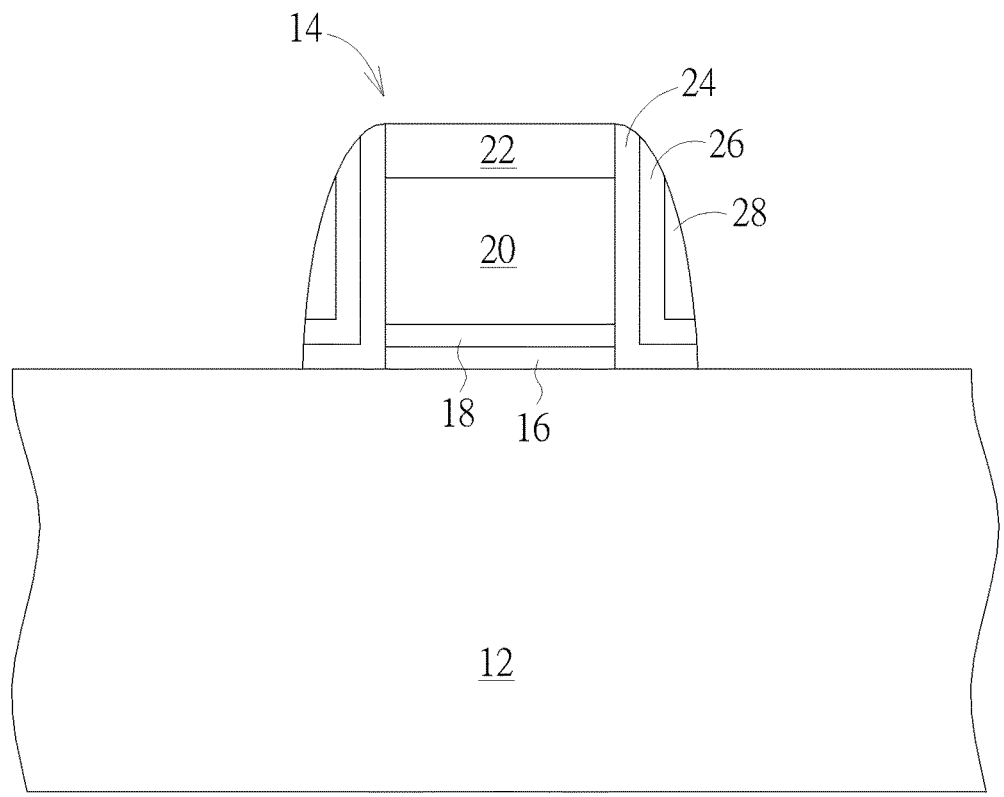
Referring to FIGS. 1-6, FIGS. 1-6 illustrate a method for fabricating semiconductor device according to an embodiment of the present invention.

Referring to FIGS. 1-6, FIGS. 1-6 illustrate a method for fabricating semiconductor device according to an embodiment of the present invention. As shown in FIG. 1, a substrate 12 is provided and at least a gate structure 14 or dummy gate is formed on the substrate 12. In this embodiment, the formation of the gate structure 14 could be accomplished by a gate first process, a high-k first approach from gate last process, or a high-k last approach from gate last process. Since this embodiment pertains to a high-k first approach, a gate dielectric layer 16 or interfacial layer, a high-k dielectric layer 18, a gate material layer 20 made of polysilicon, and a selective hard mask 22 could be formed sequentially on the substrate 12, and a pattern transfer process is then conducted by using a patterned resist (not shown) as mask to remove part of the hard mask 22, part of the gate material layer 20, part of the high-k dielectric layer 18, and part of the gate dielectric layer 16 through single or multiple etching processes. After stripping the patterned resist, a gate structure 14 made of a patterned gate dielectric layer 16, a patterned high-k dielectric layer 18, a patterned gate material layer 20, and a patterned hard mask 22 is formed on the substrate 12.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 16 could include $SiO_2$, SiN, or high-k dielectric material, the gate material layer 20 could include metal, polysilicon, or silicide, and the material of the hard mask 22 could be selected from the group consisting of $SiO_2$, SiN, SiC, and SiON.

In this embodiment, the high-k dielectric layer 18 is preferably selected from dielectric materials having dielectric constant (k value) larger than 4. For instance, the high-k dielectric layer 18 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In an embodiment of the present invention, a plurality of doped wells or shallow trench isolations (STIs) could be selectively formed in the substrate 12. Despite the present invention pertains to a planar MOS transistor, it would also be desirable to apply the process of the present invention to fabricate non-planar transistors such as FinFET devices, and in such instance, the substrate 12 shown in FIG. 1 would become a fin-shaped structure formed atop a substrate 12.

Next, at least a spacer including a spacer 24, a spacer 26, and a spacer 28 are formed on sidewalls of the gate structure 14. In this embodiment, the formation of the spacers 24, 26, 28 could be accomplished by sequentially forming multiple liners (not shown) on the surface of the substrate 12 to cover the gate structure 14, and an etching process is conducted to remove part of the liners for forming spacers 24, 26, 28 on the sidewalls of the gate structure 14. Preferably, the spacers 24 and 26 are L-shaped and the outermost spacer 28 is I-shaped, in which the spacers 24, 26, 28 at this stage could all be referred to as the first spacer. In this embodiment, the innermost spacer 24 directly contacting the gate structure 14 preferably includes silicon carbon nitride (SiCN), the middle spacer 26 directly contacting the inner spacer 24 and the outer spacer 28 preferably includes silicon oxycarbonitride (SiOCN), and the outer spacer 28 is also made of SiCN as the inner spacer 24.

In this embodiment, the thickness of each of the spacers 24, 26, 28 is preferably between 10 Angstroms to 30 Angstroms or most preferably around 25 Angstroms and the thickness of each of the inner spacer 24 and the outer spacer 28 is preferably greater than 10 Angstroms. It should be noted that even though the spacers 24, 26, 28 in this embodiment preferably share equal thickness, according to other embodiments of the present invention, the spacers 24, 26, 28 could also share equal and/or different thicknesses depending on the demand of the product. For instance, according to an embodiment of the present invention, the inner spacer 24 and the middle spacer 26 could share equal thickness while the thickness of the outer spacer 28 at this stage could be greater than the thickness of each of the inner spacer 24 and the middle spacer 26.

Figure 2:
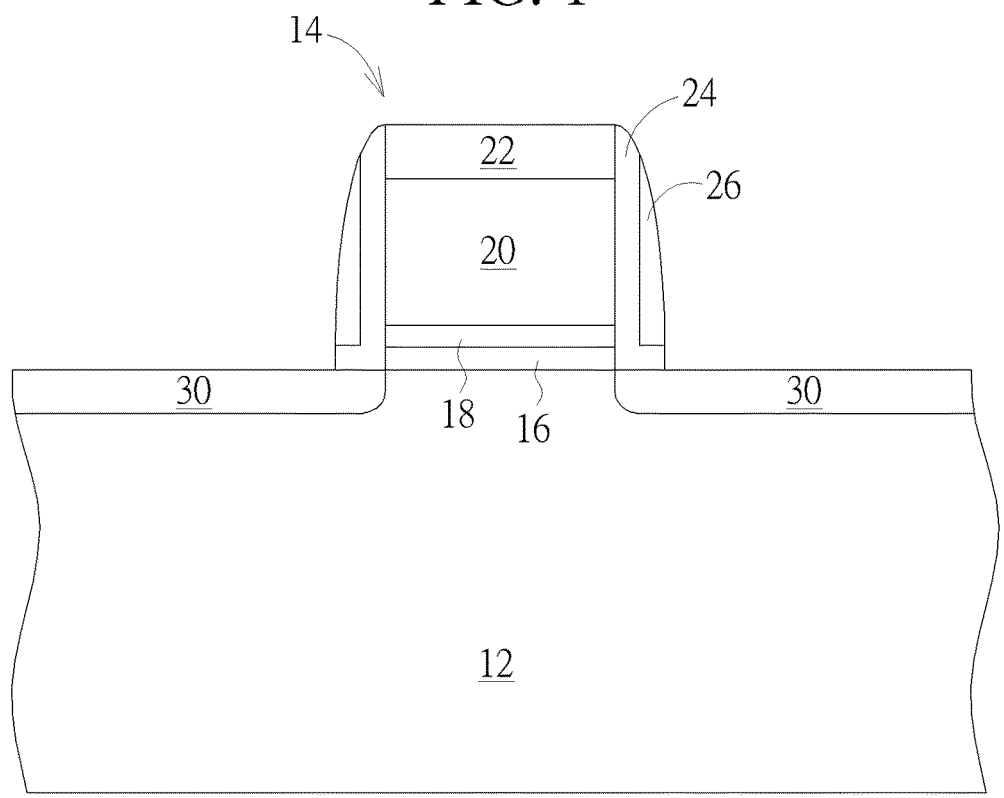

Next, as shown in FIG. 2, a lightly doped implantation process is conducted along with a rapid thermal anneal process with a temperature of approximately 930° C. to activate the dopants implanted into the substrate 12 for forming a lightly doped drain (LDD) 30 in the substrate 12 adjacent to two sides of the spacer 28. It should be noted that the outer spacer 28 could be removed by a cleaning process such as a wet clean process carried out during the formation of the lightly doped drain 30 so that only the spacers 24 and 26 are remained on sidewalls of the gate structure 14 after the lightly doped drain 30 is formed. The shaped of the middle spacer 26 is also transformed from L-shape to I-shape after the outer spacer 28 is removed.

Figure 3:
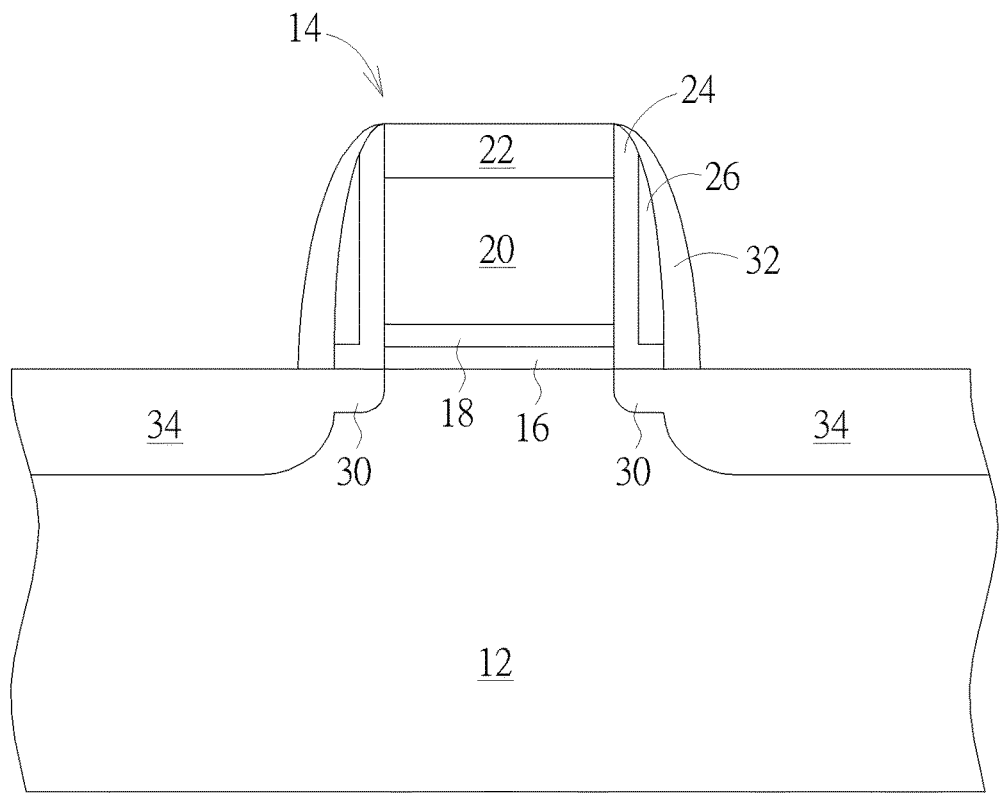

Next, as shown in FIG. 3, another liner (not shown) is formed on the substrate 12 to cover the gate structure 14 and the spacers 24, 26 and an etching process is conducted to remove part of the liner for forming another spacer 32 or second spacer on the sidewalls of the spacer 26. In this embodiment, the spacer 32 is preferably made of a material different from the spacers 24, 26 such as but not limited to for example silicon nitride. Next, a source/drain region 34 and/or epitaxial layer (not shown) is formed in the substrate 12 adjacent to two sides of the spacer 32, and a selective silicide (not shown) could be formed on the surface of the source/drain region 34 and/or epitaxial layer. The source/drain region 34 and the epitaxial layer could include dopants or materials having different conductive type depending on the type of device being fabricated. For instance, the source/drain region 34 could include p-type or n-type dopants and the epitaxial layer could include silicon germanium (SiGe), silicon carbide (SiC), or silicon phosphide (SiP), which are all within the scope of the present invention.

Figure 4:
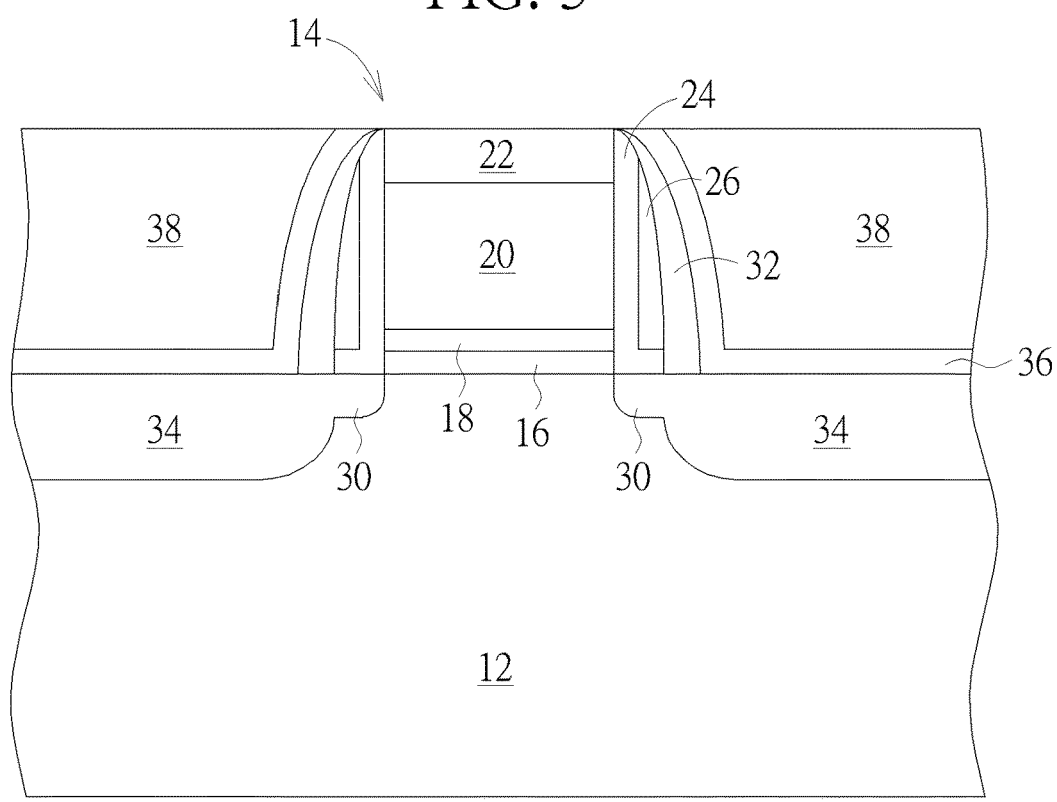

Next, as shown in FIG. 4, a contact etch stop layer (CESL) 36 is formed on the gate structure 14 and the substrate 12, in which the CESL 36 could be made of any material containing stress including but not limited to for example silicon nitride (SiN) or silicon carbon nitride (SiCN). Next, an interlayer dielectric (ILD) layer 38 is formed on the CESL 36, and a planarizing process such as chemical mechanical polishing (CMP) process is conducted to remove part of the ILD layer 38 and part of the CESL 36 so that the top surface of the hard mask 22 and the top surfaces of the remaining CESL 36 and ILD layer 38 are coplanar. Preferably the ILD layer 38 could be made of insulating material such as oxides including but not limited to for example tetraethyl orthosilicate (TEOS).

Figure 5:
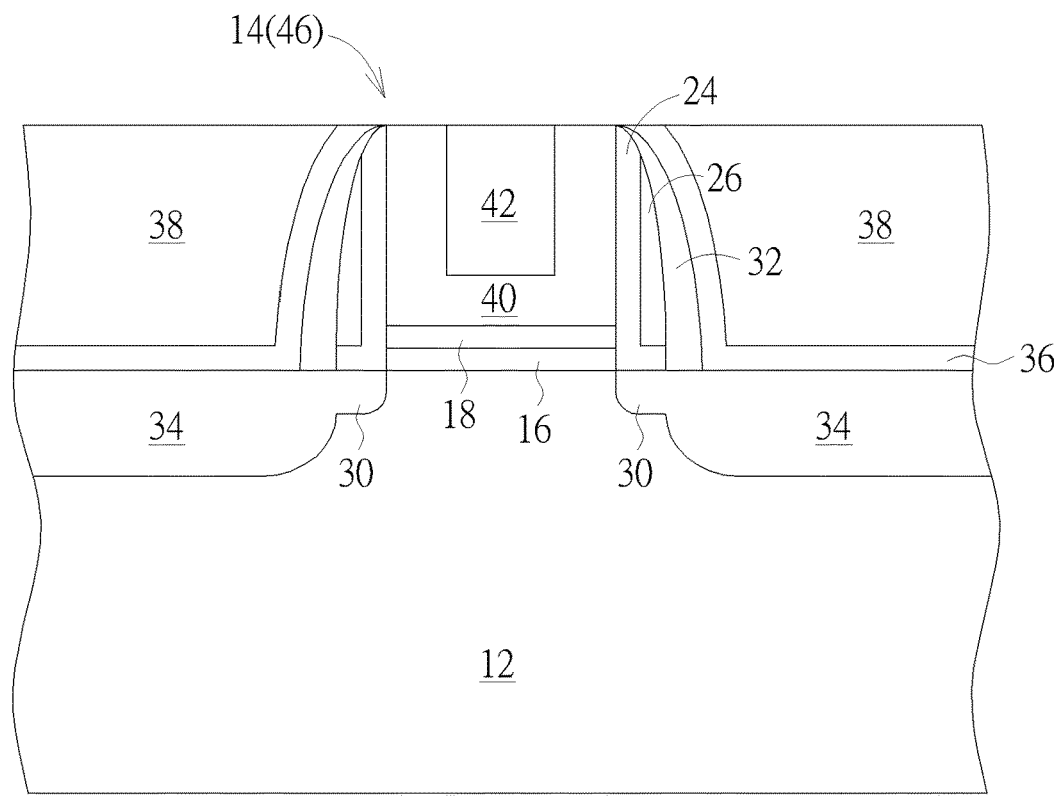

Next, as shown in FIG. 5, a replacement metal gate (RMG) process is conducted to transform the gate structure 14 into a metal gate 46. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard mask 22 and the gate material layer 20 made of polysilicon to form a recess (not shown) in the ILD layer 38. Next, a work function metal layer 40 and a low resistance metal layer 42 are formed in the recess, and a planarizing process such as CMP is conducted to remove part of low resistance metal layer 42 and part of work function metal layer 40 so that the top surfaces of the U-shaped work function metal layer 40 and the low resistance metal layer 42 are even with the top surface of the ILD layer 38.

In this embodiment, the work function metal layer 40 is formed for tuning the work function of the metal gate in accordance with the conductivity of the device. For an NMOS transistor, the work function metal layer 40 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 40 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 40 and the low resistance metal layer 42, in which the material of the barrier layer may include titanium (Ti), titanium nitride (TiN), tantalum (Ta) or tantalum nitride (TaN). Furthermore, the material of the low-resistance metal layer 42 may include copper (Cu), aluminum (Al), titanium aluminum (TiAl), cobalt tungsten phosphide (CoWP) or any combination thereof.

Figure 6:
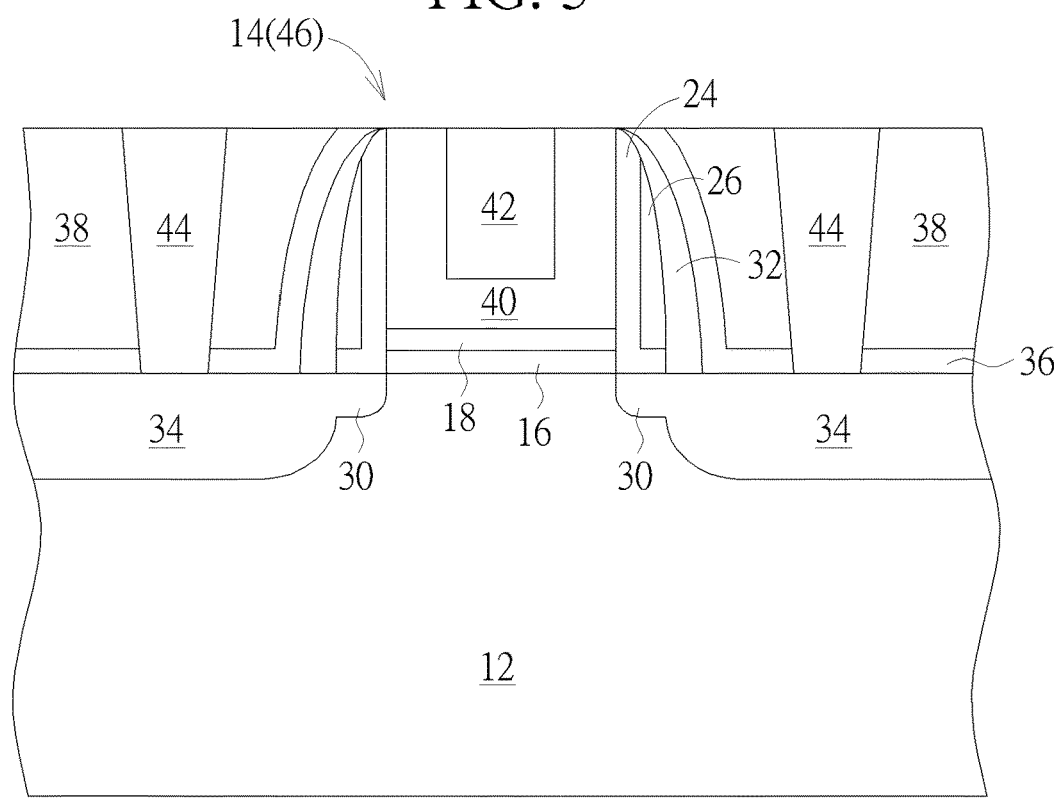

Next, as shown in FIG. 6, a contact plug formation process is conducted by first forming multiple contact holes (not shown) in the ILD layer 38 and the CESL 36, and metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 44 electrically connecting the source/drain region 34 in the substrate 12. This completes the fabrication of a semiconductor device according to an embodiment of the present invention.

Figure 7:
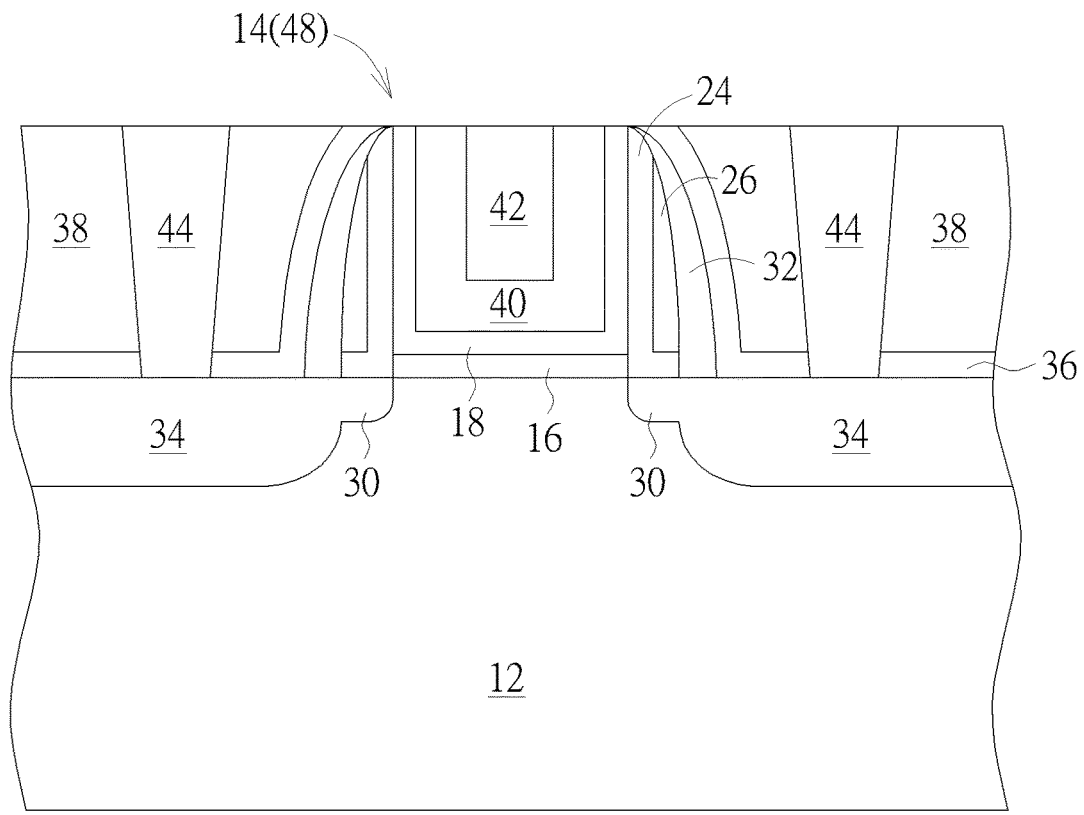
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to employing high-k first process to fabricate the metal gate transistor as shown in FIG. 6, it would also be desirable to employ a high-k last process to carry out a RMG process. In this instance, the metal gate transistor would also include a gate structure 14 having metal gate 48 disposed on the substrate 12, in which the metal gate 48 preferably includes a gate dielectric layer 16 or interfacial layer, a U-shaped high-k dielectric layer 18 disposed on the gate dielectric layer 16, a U-shaped work function metal layer 40 disposed on the high-k dielectric layer 18, and a low resistance metal layer 42 disposed on the work function metal layer 40. Since the process of high-k first approach and the high-k last approach are well known to those skilled in the art in this field, the details of which are not explained herein for the sake of brevity.

Figure 8:
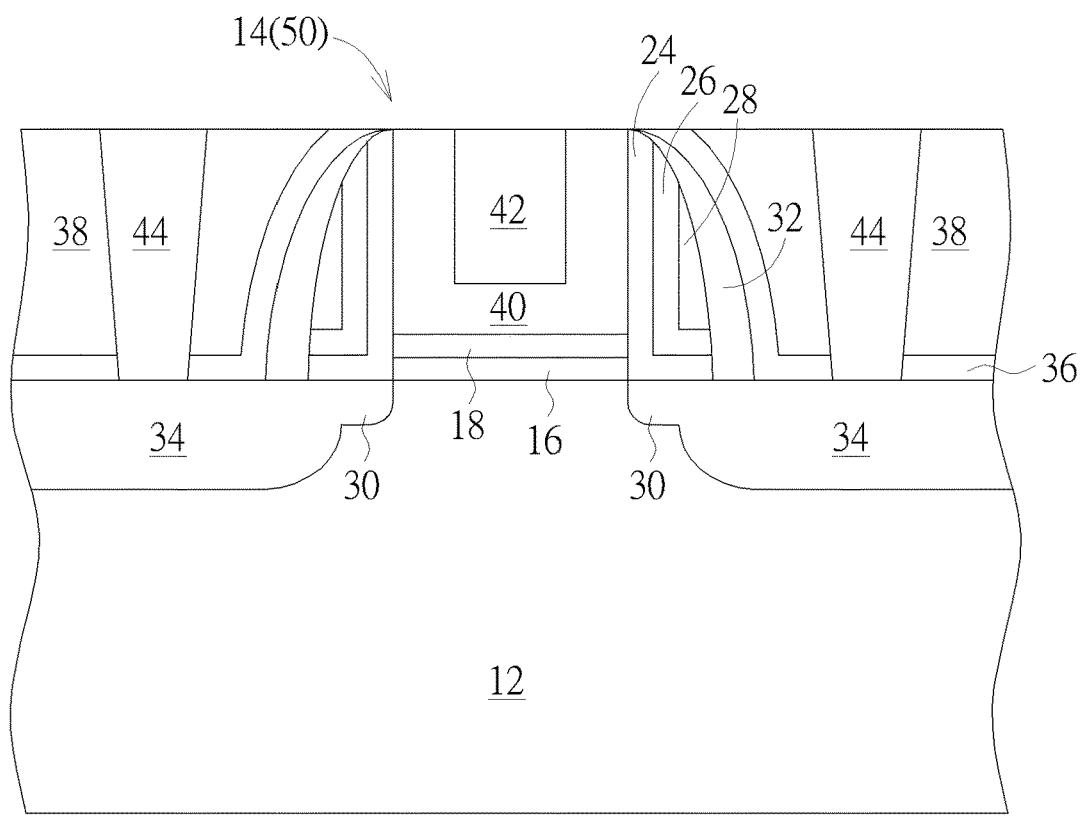
FIG. 8 illustrates a structural view of a semiconductor device according to an embodiment of the present invention.

Referring to FIG. 8, FIG. 8 illustrates a structural view of a semiconductor device according to an embodiment of the present invention. As shown in FIG. 8, in contrast of removing the outer spacer 28 during the formation of the LDD 30 as shown in FIG. 2, it would also be desirable to keep or not consuming the three spacers 24, 26, 28 during the formation of the LDD 30 so that after conducting the process in FIGS. 3-5 a total of four spacers including a L-shaped spacer 24, a L-shaped spacer 26, an I-shaped spacer 28, and another spacer 32 would be disposed on the sidewalls of the gate structure 14. Moreover, instead of employing a high-k first approach to fabricate the gate structure 14 or metal gate 50 in this embodiment, according to an embodiment of the present invention it would also be desirable to combine the composite spacer structure with a high-k last approach disclosed in the aforementioned embodiment in FIG. 7. In other words, four spacers disclosed in this embodiment would then be disposed on the sidewalls of the metal gate 48 shown in FIG. 7, which is also within the scope of the present invention.

It should also be noted that the thickness of the outer or outside spacer 28 before forming the LDD 30 could be equal to or greater than the thickness of the middle spacer 26 or the thickness of the inner or inside spacer 24. According to an embodiment of the present invention, if the thickness of the outer spacer 28 is equal to the thickness of the middle spacer 26 or the inner spacer 24 before forming the LDD 30, the outer spacer 28 is preferably removed completely after the LDD 30 is formed so that only the middle spacer 26 and the inner spacer 24 would be remained on sidewalls of the gate structure 14.

Nevertheless, if the thickness of the outer spacer 28 is greater than the thickness of the middle spacer 26 or the inner spacer 24 before forming the LDD 30, the thickness of the outer spacer 28 would be reduced substantially after forming the LDD 30 and the thickness of the remaining outer spacer 28 would preferably be less than the thickness of the middle spacer 26 or the inner spacer 24, which are all within the scope of the present invention.

Overall, the present invention discloses a spacer structure applied to metal gate transistor, in which the spacer structure could include a first spacer and a second spacer and the first spacer could further include a two-layered spacer structure or a three-layered spacer structure depending on the demand of the product. According to an embodiment of the present invention, if the first spacer were to be a two-layered spacer structure, the innermost or the spacer (such as the spacer 24) right next or directly contacting the gate structure would preferably be made of SiCN while the outer spacer (such as the spacer 26) is preferably made of SiOCN. If the first spacer were to be a three-layered spacer structure, the innermost or the spacer (such as the spacer 24) directly contacting the gate structure would preferably be made of SiCN, the middle spacer (such as the spacer 26) directly contacting the innermost spacer would preferably be made of SiOCN, and the outer spacer (such as the spacer 28) directly contacting the middle spacer would preferably be made of same material as the innermost spacer such as SiCN. The second spacer under any circumstances would preferably be made of a material different from any of the spacers in the first spacer and an example of such would be silicon nitride. According to a preferred embodiment of the present invention, the innermost spacer made of SiCN in the first spacer could be used to protect the quality of the high-k dielectric layer in the gate structure while the outermost spacer also made of SiCN could be used to define the position of the LDD thereby improving the stability and performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a gate structure on a substrate;
    forming a first spacer adjacent to and directly contacting the gate structure, wherein the first spacer comprises silicon carbon nitride (SiCN) and a L-shape;
    forming a second spacer adjacent to and directly contacting the first spacer, wherein the second spacer comprises silicon oxycarbonitride (SiOCN) and a L-shape;
    forming a third spacer adjacent to and directly contacting the second spacer, wherein the third spacer comprises SiCN and an I-shape;
    forming a fourth spacer adjacent to the third spacer, wherein the fourth spacer contacts the first spacer, the second spacer, and the third spacer directly, top surfaces of the fourth spacer and the gate structure are coplanar, and the fourth spacer is disposed not directly above the gate structure; and
    forming a source/drain region adjacent to two sides of the third spacer.

* * * * *